United States Patent
Makimoto

(10) Patent No.: US 6,830,958 B2
(45) Date of Patent: Dec. 14, 2004

(54) METHOD OF MAKING CHIP SCALE PACKAGE

(75) Inventor: Hirofumi Makimoto, Kumamoto (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/246,445

(22) Filed: Sep. 19, 2002

(65) Prior Publication Data

US 2003/0173656 A1 Sep. 18, 2003

(30) Foreign Application Priority Data

Mar. 18, 2002 (JP) ........................................ 2002-074931

(51) Int. Cl.[7] .................. H01L 21/44; H01L 21/48; H01L 21/50
(52) U.S. Cl. .................. 438/110; 438/113; 438/114; 438/126; 438/127; 438/108; 438/455; 438/458; 438/460; 438/465; 257/787; 257/778; 257/723
(58) Field of Search ................... 438/113, 110, 438/126, 127; 257/787, 778

(56) References Cited

U.S. PATENT DOCUMENTS 5,879,964 A * 3/1999 Paik et al. ................. 438/113
6,281,047 B1 * 8/2001 Wu et al. ................... 438/113
6,376,278 B1 * 4/2002 Egawa et al. .............. 438/110
6,541,308 B2 * 4/2003 Ito et al. .................... 438/113

FOREIGN PATENT DOCUMENTS

JP          9-232256       9/1997
JP          2001-35972     2/2001

* cited by examiner

*Primary Examiner*—Nitin Parekh
(74) *Attorney, Agent, or Firm*—Leydig, Voit & Mayer, Ltd.

(57) ABSTRACT

A semiconductor wafer and a substrate are positioned facing each other, and electrode pads of individual semiconductor chips and connecting electrode pads of package bases are bonded simultaneously. The semiconductor wafer and the substrate are cut at the same time and divided into semiconductor chips. After expanding spaces between the divided semiconductor chips a predetermined width in an expanding process, a sealing resin is applied so that the large number of semiconductor chips and package bases are sealed with the resin at the same time. Then the semiconductor chips are cut and divided into separate pieces. Thus, semiconductor devices sealed with a resin are formed.

3 Claims, 3 Drawing Sheets

METHOD OF MAKING CHIP SCALE PACKAGE

BACKGROUND OF THE INVENTION

1. Field of the Invention

The present invention relates to a semiconductor device and a method of manufacturing the semiconductor device and, more particularly, relates to a semiconductor device having a chip scale package (hereinafter referred to as CSP) structure and to a method of manufacturing the semiconductor device.

2. Background Art

It is a recent trend that electronic equipment has been smaller and lighter, and under such a trend, smaller and lighter semiconductor packages have been increasingly demanded as a matter of course.

CSP is a general term of a package size equal to or slightly bigger than size of a semiconductor chip. Generally, CSP has a structure in which semiconductor chips are mounted on a package base of a size equal to or slightly bigger than the size of the semiconductor chips. Electrodes of the semiconductor chips and those of the package base are electrically connected, and they are sealed with a resin.

The CSP has been conventionally formed by a method in which a semiconductor wafer is cut into semiconductor chips, then the semiconductor chips are mounted on a substrate serving as a package base at predetermined positions and bonded thereto, and they are collectively sealed with a resin, thereafter the sealing resin and the substrate are cut into pieces together at the parts between the semiconductor chips. In another conventional method, a semiconductor wafer (not being cut into semiconductor chips yet) is mounted on a substrate and bonded thereto, then the semiconductor wafer and the substrate are cut together, and the cut and divided semiconductor chips and package bases are sealed with a resin. However, in the former conventional manufacturing method, a problem exists in that the method essentially includes a step of positioning and mounting the cut and divided semiconductor chips one by one on the substrate. Like wise in the latter conventional manufacturing method, a problem exists in that the method essentially includes a step of sealing the cut and divided semiconductor chips and package bases one by one with a resin. Both conventional methods require a number of working processes equal to the number of semiconductor chips, which results in a disadvantage of low productivity.

To overcome the foregoing problems, Japanese Patent Publication (unexamined) No. Hei 9-232256, and Japanese Patent Publication (unexamined) No. 2001-35972 proposed a method of forming a semiconductor device having a CSP structure. The proposed method includes the steps of mounting and bonding a semiconductor wafer (not being cut into semiconductor chips yet) on a substrate, cutting only the semiconductor wafer into semiconductor chips, filling spaces between the cut semiconductor chips as well as between the semiconductor chips and the substrate with a sealing resin, and then cutting together the sealing resin and the substrate between the semiconductor chips at the same time.

Further the Japanese Patent Publication (unexamined) No. 2001-35972 proposed a method of forming a semiconductor device having a structure. In this proposed method, at the time of cutting the semiconductor wafer into semiconductor chips, a part of the substrate is also cut and filled with a sealing resin at the same time. Thus not only side faces of the semiconductor chips and parts between the semiconductor chips and the package bases but also a part of side faces of the package bases are sealed with a resin.

In the mentioned conventional semiconductor device having a CSP structure and proposed for the purpose of reducing number of working processes, a semiconductor wafer is cut into semiconductor chips in the state of mounting the semiconductor wafer on the substrate, and the sealing resin for filling the spaces formed by cutting the semiconductor wafer is used as a sealing material when the semiconductor chips are divided into separate pieces. Therefore, dicing lines that include a sealing resin must be provided on the semiconductor wafer at the parts between the individual semiconductor chips to be formed, and this causes a problem of reducing number of semiconductor chips obtained from one wafer.

Moreover, the sealing with a resin is performed in the state that the substrate on which the semiconductor chips are mounted is not completely cut, and therefore side faces (cut faces) of the package bases formed by cutting the substrate remain not sealed with the resin. Thus another problem exists in that the semiconductor device formed by such manufacturing method is low in reliability due to moisture absorption from the side faces of the package bases and so on.

SUMMARY OF THE INVENTION

The present invention was made to resolve the above-discussed problems and has an object of providing a highly reliable semiconductor device and a method of manufacturing the semiconductor device, in which number of working processes can be reduced without decreasing number of semiconductor chips obtained from one piece of wafer, thus productivity being improved.

To accomplish the foregoing object, a semiconductor device according to the invention includes: semiconductor chips mounted on package bases; electrode pads provided on the semiconductor chips; and connecting electrode pads provided on the package bases; the electrode pads being electrically connected to the connecting electrode pads: and in which spaces where the semiconductor chips and the package bases are joined together are filled with a sealing resin; and side faces of the semiconductor chips and side faces of the package bases are continuously coated with the sealing resin.

As a result of such a structure, cut faces of the base member forming the package bases of which hygroscopicity tends to be relatively high are not exposed, and the portions where the semiconductor chips and the package bases are joined together are protected by the sealing member. Therefore, not only the semiconductor device becomes highly moisture-resistant, but also strength of the portions where the semiconductor chips and the package bases are joined together is increased. Consequently it is possible to obtain a highly reliable semiconductor device.

A method of manufacturing a semiconductor device according to the invention includes the steps of: positioning and mounting a semiconductor wafer, where a large number of semiconductor chips are formed, on a substrate, where large number of package bases are formed, and flip-chip-bonding electrode pads respectively provided on the semiconductor chips and connecting electrode pads respectively provided on the package bases; mounting the flip-chip-bonded semiconductor wafer and substrate on a dicing sheet and cutting and dividing the semiconductor wafer and the substrate into semiconductor chips; filling with a sealing resin spaces between adjoining semiconductor chips as well as between adjoining package bases and spaces where the bonded semiconductor chips and package bases are joined, while expanding the dicing sheet thereby expanding spaces between the cut semiconductor chips; and cutting the large number of bonded semiconductor chips and package bases sealed with the resin into separate pieces of semiconductor chips with the sealing resin left on both sides of cut faces.

As a result of such manufacturing process, the semiconductor wafer formed with the large number of semiconductor chips is positioned and mounted on the substrate formed with the large number of package bases, and the semiconductor chips and the package bases are collectively sealed with a resin. Consequently, any working process such as handling and bonding the semiconductor chips one by one is no longer necessary, thus the productivity is improved. Furthermore, after the bonded semiconductor chips and package bases are cut into separate pieces, the spaces for forming the sealing resin necessary for the semiconductor device are provided between the adjoining semiconductor chips by the expanding process. Accordingly, at the time of forming the semiconductor chips on the wafer, it is not necessary to provide any space for forming the sealing resin between the adjoining semiconductor chips. Therefore, number of semiconductor chips obtained from one piece of wafer is increased as much resulting in improvement of production efficiency. Thus the invention can provide a highly productive manufacturing method of a semiconductor device.

DESCRIPTION OF THE PREFERRED EMBODIMENTS

Embodiment 1.

Figure 1A:
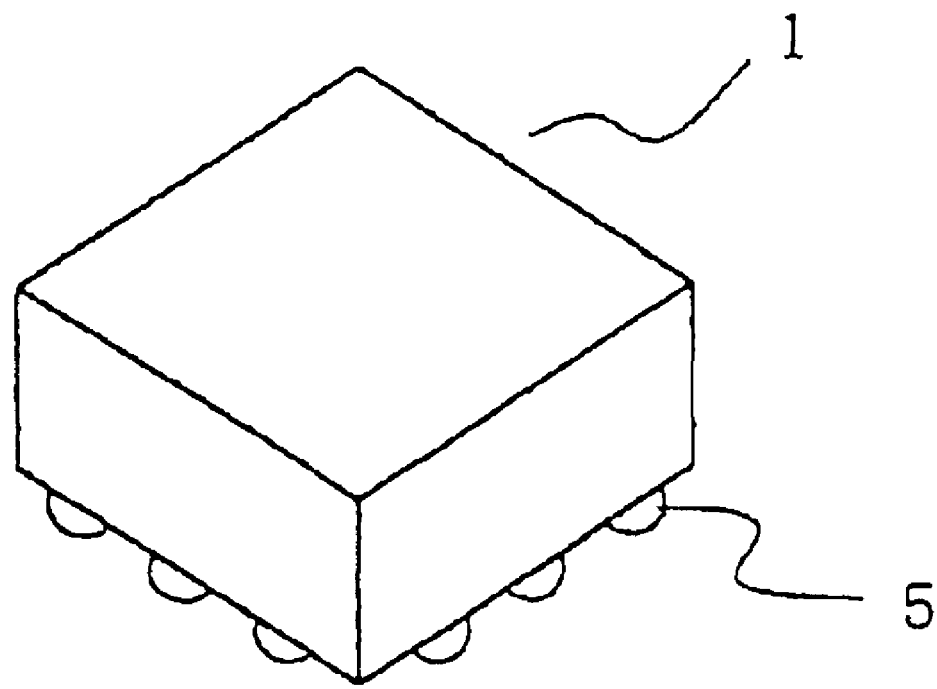
FIGS. 1(a) and 1(b) are schematic views showing a semiconductor device according to Embodiment 1 of the present invention.
Figure 1B:
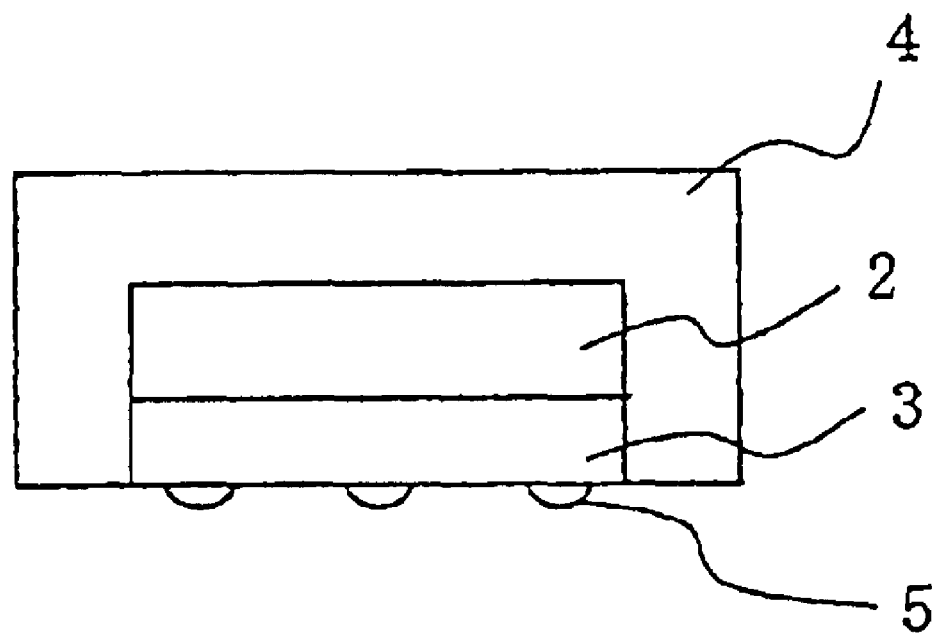

An embodiment of the invention is hereinafter described with reference to the accompanying drawings. FIGS. 1(a) and (b) are schematic views each showing a semiconductor device according to Embodiment 1 of the present invention, and in which (a) is a perspective view and (b) is a sectional view. FIGS. 2(a) to (e) are views each for explaining a manufacturing method of the semiconductor device according to Embodiment 1 of the invention, and in which (a) and (b) are perspective views, and (c), (d) and (e) are sectional views.

In the drawings, reference numeral 1 is a semiconductor device, numeral 2 is a semiconductor chip, numeral 3 is a package base, numeral 4 is sealing resin made of, for example, an insulating epoxy resin, numeral 5 is an external terminal (a bump made of gold, solder, or the like in this embodiment) for connection with an external substrate, numeral 6 is a semiconductor wafer from which a large number of semiconductor chips 2 are formed, numeral 7 is a substrate made of a glass epoxy base material and so on from which a large number of package bases 3 are formed, numerals 8a and 8b are adhesive dicing sheets made of vinyl chloride and so on, and numeral 9 is a ring for dicing.

Now, a process of manufacturing the semiconductor device according to this embodiment is hereinafter described.

Figure 2A:
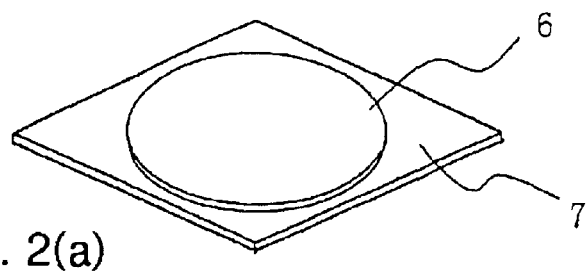
FIGS. 2(a) to 2(e) are views for explaining a manufacturing method of the semiconductor device according to Embodiment 1 of the invention.

First, as shown in FIG. 2(a), the semiconductor wafer 6 is placed on the substrate 7 facing each other, and positioning is conducted using alignment marks (not shown) preliminarily given on the semiconductor wafer 6 and the substrate 7 respectively. Then electrode pads (not shown) of the respective semiconductor chips 2 formed on the semiconductor wafer 6 and connecting electrode pads (not shown) on the substrate 7 (serving as the package bases 3) provided at places corresponding to the electrode pads are coincided to each other and bonded together. Then the electrode pads of the semiconductor chips 2 and the connecting electrode pads of the package bases 3 are electrically connected.

In addition, the electrode pads of the semiconductor chips 2 and the connecting electrode pads of the package bases 3 are bonded (flip-chip-bonding) using bumps made of gold, solder, or the like formed on the electrode pads on one side by any publicly known connection technique such as thermocompression bonding.

Figure 2B:
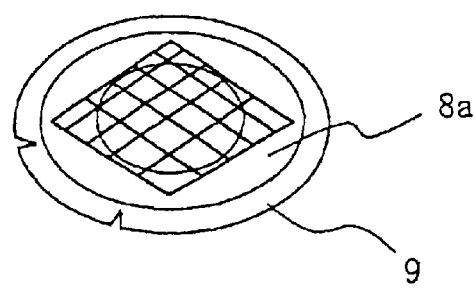

Subsequently, as shown in FIG. 2(b), side of the substrate 7 (to another side of which the semiconductor wafer 6 is bonded) is fixedly placed on an adhesive dicing sheet, and the semiconductor wafer 6 and the substrate 7 are cut together to be divided into semiconductor chips 2. Then, the dicing sheet 8a is expanded, whereby each space between the adjoining semiconductor chips is expanded to a predetermined width.

The spaces between the semiconductor chips 2 formed by the expanding process are established to be a value obtained by adding a dicing line width required for cutting to the double of the sealing resin thickness required at the time of forming the semiconductor device 1.

Figure 2C:
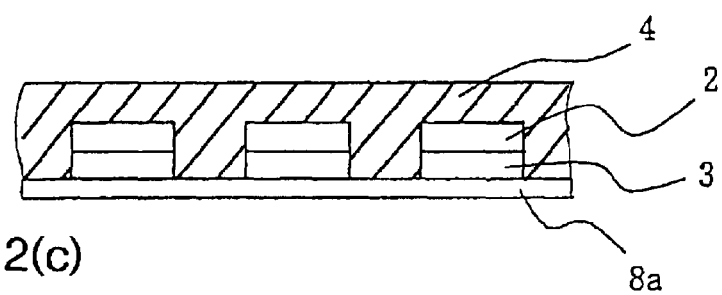

Then, as shown in FIG. 2(c), the sealing resin 4 is supplied to the large number of bonded semiconductor chips 2 and package bases 3 kept with a predetermined space between them on the dicing sheet 8a, thus the spaces where the bonded semiconductor chips 2 and package bases 3 are joined and surroundings of the bonded semiconductor chips 2 and package bases 3 are filled with the sealing resin 4, and the sealing resin 4 is hardened.

The semiconductor chips 2 and the package bases 3 are sealed by any method such as applying, spraying, transfer molding, electrodepositing or the like.

Figure 2D:
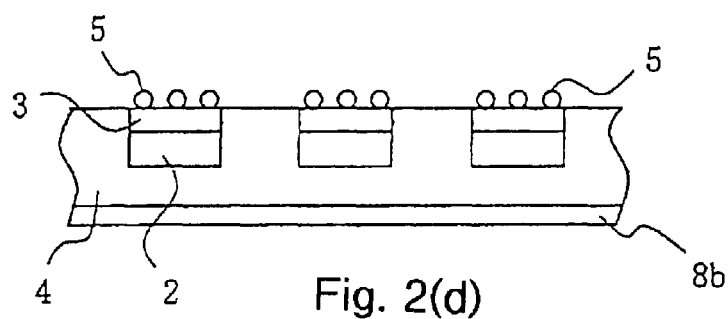

Then, as shown in FIG. 2(d), another dicing sheet 8b is pasted on the semiconductor chip 2 side of the large number of semiconductor chips 2 and package bases 3 sealed with the resin, and the dicing sheet 8a on the side of the package base 3 is exfoliated. The large number of semiconductor chips 2 and package bases 3 sealed with the resin pasted on the dicing sheet 8b is turned so that the package base 3 side comes to upside. Then the bumps 5 made of gold, solder or the like serving as external terminals for connection with the external substrate are formed on external electrode pads (not shown) provided on the package bases 3.

The connecting electrode pads and the external electrode pads provided on the package bases 3 are electrically connected via through holes or the like provided on the package bases 3.

Figure 2E:
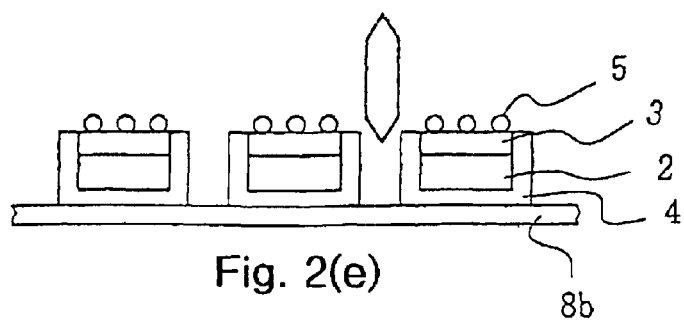

Then, as shown in FIG. 2(e), the large number of semiconductor chips 2 and package bases 3 sealed with the resin on the dicing sheet 8b are cut into separate pieces of semiconductor chips 2 (package bases 3) while the sealing resin of a predetermined thickness being left on both sides of cut faces.

In the cutting step of the semiconductor chips 2 and package bases 3 sealed with the resin, only the sealing resin material not including any other material is subject to cutting, and it is therefore possible to use a laser beam or the like instead of cutting with a generally used cutting blade.

By the foregoing steps, a semiconductor device having a CSP structure is formed, and in which the space where the semiconductor chip 2 and the package base 3 are joined together is filled with the sealing resin, and five faces other than the face where the bumps 5 serving as external terminals of the package base 3 are formed are coated with the sealing resin.

Figure 3:
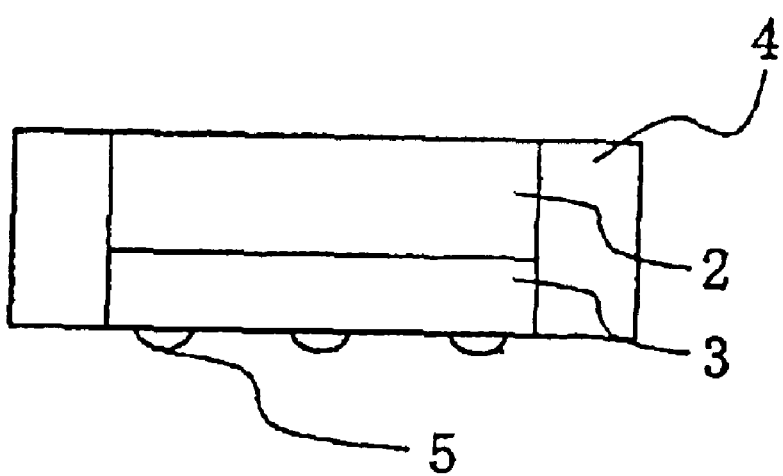
FIG. 3 is a schematic view for explaining another manufacturing method of the semiconductor device according to Embodiment 1 of the invention.

In addition, as shown in FIG. 3, the upper face of the semiconductor chip 2 (on the back side of the face where the electrode pads are formed) of relatively low hygroscopicity is not always necessary to be covered with the sealing resin 4.

In the foregoing manufacturing method, a dicing sheet holding the large number of semiconductor chips 2 and package bases 3 sealed with resin is pasted on the semiconductor chip 2 side from the package base 3 side, and the semiconductor chips 2 and the package bases 3 are cut and divided into separate pieces after forming the bumps 5 for connection with the external substrate. However, in the case where it is not necessary to form the bumps 5 on the external electrode pads of the package bases 3, it is also preferable to form the semiconductor device 1 by cutting the semiconductor chips 2 and the package bases 3 into separate pieces of semiconductor chips 2 while holding the package base 3 side held on the dicing sheet 8a (FIG. 2(c)).

As a result of employing the mentioned arrangement, in this embodiment, the semiconductor device has a structure in which five faces other than the face, where the bumps 5 serving as external terminals of the package base 3 are formed, are continuously coated with the sealing resin 4. Cut faces and other parts of the base material forming the package base 3 where hygroscopicity tends to be relatively high are not exposed, and the portion where the semiconductor chip 2 and the package base 3 are joined together are protected by the sealing member. Consequently, the semiconductor device 1 can be highly moisture-resistant, and strength of the portion where the semiconductor chip 2 and the package base 3 are joined together can be increased.

Further, in the manufacturing method according to this embodiment, the semiconductor wafer 6 where the large number of semiconductor chips 2 are placed, positioned and bonded on the substrate 7 where the large number of package bases 3 are formed, and the semiconductor chips 2 and the package bases 3 are collectively sealed with a resin. As a result, a working process of handling the semiconductor chips 2 one by one is no more necessary, which improves productivity.

Furthermore, after cutting the large number of semiconductor chips 2 formed on the semiconductor wafer 6, spaces for forming the sealing resin 4 necessary for the semiconductor device 1 are arranged between the adjoining semiconductor chips 2 by the expanding process. As a result, it is no more necessary to provide spaces for forming the sealing resin 4 between the adjoining semiconductor chips 2 at the time of forming the semiconductor chips 2 on the wafer, and it is possible to increase number of semiconductor chips 2 obtained from one piece of wafer.

For example, supposing that a sealing resin of 50 μm in thickness is provided on one side of a semiconductor device, in the manufacturing method shown in this embodiment, it is sufficient that each space between the adjoining semiconductor chips formed at the time of forming the semiconductor chips on the wafer has only a width (approximately 50 μm) required for cutting the semiconductor chips. On the other hand, in the prior arts such as the Japanese Patent Publication (unexamined) No. 232256/1997, the Japanese Patent Publication (unexamined) No. 35972/2001, and soon, the spaces between the adjoining semiconductor chips formed at the time of forming the semiconductor chips on the wafer must be a width (approximately 150 μm) obtained by adding a width (approximately 50 μm) necessary for cutting the sealing resin and the substrate to the double (for sealing adjoining two chips) of the thickness (50 μm) of the sealing resin formed at the time of forming the semiconductor device.

The semiconductor device and the manufacturing method thereof according to the present invention have additional features and advantages as follows:

The sealing resin coats the backside of the faces of the semiconductor chips opposed to the package bases, and consequently the semiconductor chips can be highly improved in moisture-resistance.

It is preferable that the mentioned manufacturing method of a semiconductor device further includes the steps of: pasting the semiconductor chips and package bases sealed with a resin on another dicing sheet on the semiconductor chip side, and exfoliating the dicing sheet on the package base side, after filling with the sealing resin the spaces between the adjoining semiconductor chips as well as between the adjoining package bases and the spaces where the bonded semiconductor chips and package bases are joined, while expanding the semiconductor chips and the package bases on the dicing sheet; and forming bumps serving as external terminals on external electrode pads provided on the package base side where the dicing sheet has been exfoliated, and in which after forming the bumps, the large number of bonded semiconductor chips and package bases sealed with the resin are cut into separate pieces of semiconductor chips.

As a result of such manufacturing process, the bumps serving as external terminals are formed on the external electrode pads provided on the face of the package bases under the state that the large number of semiconductor chips and package bases are collectively sealed with the resin. Consequently it is possible to efficiently form the bumps without handling the semiconductor devices one by one.

In the step of filling with a sealing resin spaces between said adjoining semiconductor chips as well as between said adjoining package bases and spaces where said bonded semiconductor chips and package bases are joined, the upper face of the semiconductor chips (back side of the faces of said semiconductor chips opposed to said package bases) can be simultaneously coated with said sealing resin. Consequently, the semiconductor chips can be highly improved in moisture-resistance without any additional step for such coating.

What is claimed is:

1. A method of manufacturing a semiconductor device comprising:

positioning and mounting a semiconductor wafer on a substrate, said substrate including a plurality of package bases, and flip-chip-bonding respective electrode pads on said semiconductor wafer to respective connecting electrode pads of said package bases;

mounting said flip-chip-bonded semiconductor wafer and substrate on a first dicing sheet, with said first dicing sheet in contact with said substrate;

cutting and dividing said semiconductor wafer and said substrate into respective semiconductor chips, each semiconductor chip including a semiconductor die bonded to a respective package base;

stretching said first dicing sheet, thereby increasing spacing between respective adjacent semiconductor chips;

while said first dicing sheet is stretched, filling spaces between respective adjacent semiconductor chips with a sealing resin; and cutting said sealing resin between respective adjacent semiconductor chips to produce cut faces so that only said sealing resin is exposed at said cut faces.

2. The method of manufacturing a semiconductor device according to claim 1, comprising, after filling the spaces between respective adjacent semiconductor chips with said sealing resin, before cutting said sealing resin, and while said first dicing sheet is stretched, mounting said semiconductor chip sealed with said sealing resin on a second dicing sheet applied to said sealing resin, and removing said first dicing sheet from said package bases; and forming bumps on external electrode pads on said package bases from which said first dicing sheet has been removed, and, after forming said bumps, cutting said sealing resin to produce said semiconductor chips.

3. The method of manufacturing a semiconductor device according to claim 1, including, in filling the spaces between respective adjacent semiconductor chips with said sealing resin, coating back faces of said semiconductor chips with said sealing resin, said back faces being opposed to said first dicing sheet.

* * * * *